(12) United States Patent
Chang et al.

(10) Patent No.: US 7,369,957 B2
(45) Date of Patent: May 6, 2008

(54) METHOD AND SYSTEM FOR GENERATING TEST PULSES TO TEST ELECTRONIC ELEMENTS

(75) Inventors: Shih-Bou Chang, Hsin-Chu (TW); Diann-Fang Lin, Hsin-Chu (TW)

(73) Assignee: King Yuan Electronics Co., Ltd., Hsin-chu (TW)

( * ) Notice: Subject to any disclaimer, the term of this patent is extended or adjusted under 35 U.S.C. 154(b) by 0 days.

(21) Appl. No.: 11/707,885

(22) Filed: Feb. 20, 2007

(65) Prior Publication Data

US 2007/0156368 A1    Jul. 5, 2007

Related U.S. Application Data

(63) Continuation-in-part of application No. 10/935,084, filed on Sep. 8, 2004, now abandoned.

(30) Foreign Application Priority Data

Mar. 19, 2004    (TW) .............................. 93107539 A

(51) Int. Cl.
G06F 19/00    (2006.01)

(52) U.S. Cl. ..................... 702/117; 702/123; 702/125

(58) Field of Classification Search ................. 702/117, 702/123, 124, 125, 189, 74; 375/350, 360, 375/222

See application file for complete search history.

(56) References Cited

U.S. PATENT DOCUMENTS

| 4,885,583 | A | * | 12/1989 | McCambridge ............. 341/100 |
| 2002/0009132 | A1 | | 1/2002 | Miller |
| 2003/0043926 | A1 | | 3/2003 | Terashima et al. |

* cited by examiner

*Primary Examiner*—Bryan Bui
(74) *Attorney, Agent, or Firm*—Birch, Stewart, Kolasch & Birch, LLP

(57) ABSTRACT

A method and system for generating test pulses to test electronic elements are disclosed. After determining a transmission clock, which is smaller than a test clock, and a serial of predetermined pulses, the serial of data bits corresponding to the serial of predetermined pulses can be generated. Then the serial of data bits can be transformed into a serial data stream for transmission. By transmitting the serial data stream according to the transmission clock, the serial of predetermined pulses corresponding to the test clock can be generated.

11 Claims, 3 Drawing Sheets

METHOD AND SYSTEM FOR GENERATING TEST PULSES TO TEST ELECTRONIC ELEMENTS

This application is a continuation-in-part of U.S. patent application Ser. No. 10/935,084, filed Sep. 8, 2004 now abandoned.

BACKGROUND OF THE INVENTION

1. Field of the Invention

The present invention generally relates to a method and system for generating test pulses, and more particularly to a method and system for programmable generating test pulses.

2. Description of the Prior Art

As is known, tests on electronic element such as IC (integrated circuit) could be categorized into the following three types, direct current parametric test, dynamic functional test, and alternating current test. Among these three types, dynamic functional test is more complicated and important than other tests. In order to perform dynamic functional test of an electronic element, it is required to have a driver for generating test pulses to drive the electronic element, a comparator for examining the output pulses of the electronic element, and a power supply for generating stable currency. Test pulses generated by the driver are sent into an electronic element to be tested. The electronic element to be tested is driven by these test pulses and produces correspondent output pulses, which would be received and examined by the comparator. At the end, the comparator would compare the received output pulses with a serial of predetermined pulses to determine the functional test result of the tested electronic element.

In this regard, test pulses are different for adapting to the different electronic element to be tested. It means that the driver for generating test pulses is also required to change for varied electronic elements. Since the test pulses for an electronic element are usually quite complicated and the differences of test pulses for different electronic elements are quite significant, the driver is needed to be customized for each electronic element. Therefore most of customized drivers are made of ASIC (Application Specified Integrated Circuit) that consumes lots of costs and time to design before test. Besides, the customized drivers are not reusable for other test cases.

Generally speaking, the input and output signals of an electronic element are called pulses, which have three measurable elements, time duration, voltage, and represented logical data, respectively. As shown in FIG. 1A, signal 10 is a serial of continuous pulses, which could be interpreted as a combination of a logical data 1 and a logical data 0. Logical data 1 and 0 may be represented by a correspondent higher voltage, VH, and a correspondent lower voltage, VL, respectively. Logical data may be represented in other alternative ways. For example logical data 1 could be represented by a signal bounce from VL to VH. The entire duration of the logical data 1 is T1; the voltage is raised from VL to VH after duration T2 from the beginning; and then the voltage is further returned to VL after duration T3.

Signals, which are produced by a typical clock generator (TG), have fixed periods. A main clock (MC) with a period T1 is designated as the basis of the logical data 1. A first clock (C1) has the same period of MC is delayed for a duration of T2. Similarly, a second clock (C2) also has the same period as MC is delayed fro a duration of T2+T3. Both of C1 and C2 are produced by applying different delay lines on signals of MC. In order to generate a pulse such as logical data 1, it is required to combine a pattern signal (P), MC, C1, and C2. The pattern signal (P) is used to provide a combination of VH and VL.

In the consequence, as shown in FIG. 1B, a typical driver comprises a clock generator (TG), a pattern generator (PG), a programmable data selector (PDS), a format controller (FC), and a voltage input (VI). Timing clock sequences such as above-mentioned MC, C1, and C2 are generated by the clock generator. Varied patterns could be generated by the pattern generator and be further directed to designated paths by the programmable data selector. At last, pulses are modulated by the format controller and are amplified in an appropriate range of voltage by the voltage input.

To summarize, the generation of test pulses is to combine the timing clock sequences from the TG with the patterns from the PG by the format controller. And the delay lines are also required to produce varied timing clock sequences. Moreover, the working clock of the electronic element goes higher, and the delayed duration of delay line goes shorter in contrary. However, for the test on high frequency electronic elements such as radio frequency (RF) communication chips, the delay duration of digital delay line may not be short enough to fulfill the requirement of test. Instead, it requires analog delay lines to produce qualified short delay duration. Most drivers are made of ASIC that could provide merely some certain fixed timing clock sequences. Because different test electronic elements are generated from different patterns, these patterns should be generated from varied timing clock sequences that ASIC drivers could not provide. For current test apparatus on high frequency electronic elements, the shortcomings include high costs, lack of reusability, and the need of excess analog logics. It is desired to have a new method and system for solving these mentioned shortcomings to reduce costs and increase test performance.

SUMMARY OF THE INVENTION

One improvement against the shortcomings mentioned above, a method and system for generating high frequency test pulses without applying analog delay lines is disclosed in accordance with the present invention.

Besides, another improvement of the present invention is the disclosure of a method and system for programmable and reusable generating high frequency test pulses.

According to these mentioned improvements, a method for generating test pulses to test electronic elements is disclosed in accordance with the present invention. In this case, a transmission clock, a test clock which has a smaller frequency than the transmission clock, and a serial of predetermined pulses corresponding to the test clock are determined, and a serial of data bits would be generated according to the serial of predetermined pulses and the transmission clock. Furthermore, a serial data stream could be transformed from the series of data bits. At last, a serial of test pulses could be derived from the serial of data stream and the test clock.

In this regard, the present invention discloses a system for generating test pulses to test electronic elements, which comprises a clock generator, a storage unit, a transformation unit, and a transmission unit. At first, the transmission clock and the test clock (which has a smaller frequency than the transmission clock) generated by the clock generator are dispatched to the transmission unit and the electronic element, respectively. Secondly, the serial of data stream corresponding to the transmission clock could be transformed by the transformation unit from the serial of data bits stored in the storage unit. Finally, a serial of test pulses corresponding to the test clock could be derived by the transmission unit from the serial of data stream corresponding to the transmission clock. delay lines to produce qualified short delay duration. Most drivers are made of ASIC that could provide merely some certain fixed timing clock sequences. Because different test electronic elements are generated from different patterns, these patterns should be generated from varied timing clock sequences that ASIC drivers could not provide. For current test apparatus on high frequency electronic elements, the shortcomings include high costs, lack of reusability, and the need of excess analog logics. It is desired to have a new method and system for solving these mentioned shortcomings to reduce costs and increase test performance.

SUMMARY OF THE INVENTION

One improvement against the shortcomings mentioned above, a method and system for generating high frequency test pulses without applying analog delay lines is disclosed in accordance with the present invention.

Besides, another improvement of the present invention is the disclosure of a method and system for programmable and reusable generating high frequency test pulses.

According to these mentioned improvements, a method for generating test pulses to test electronic elements is disclosed in accordance with the present invention. In this case, a transmission clock, a test clock which has a smaller frequency than the transmission clock, and a serial of predetermined pulses corresponding to the test clock are determined, and a serial of data bits would be generated according to the serial of predetermined pulses and the transmission clock. Furthermore, a serial data stream could be transformed from the series of data bits. At last, a serial of test pulses could be derived from the serial of data stream and the test clock.

In this regard, the present invention discloses a system for generating test pulses to test electronic elements, which comprises a clock generator, a storage unit, a transformation unit, and a transmission unit. At first, the transmission clock and the test clock (which has a smaller frequency than the transmission clock) generated by the clock generator are dispatched to the transmission unit and the electronic element, respectively. Secondly, the serial of data stream corresponding to the transmission clock could be transformed by the transformation unit from the serial of data bits stored in the storage unit. Finally, a serial of test pulses corresponding to the test clock could be derived by the transmission unit from the serial of data stream corresponding to the transmission clock.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings, which are given by way of illustration only, and thus are not limitative of the present invention, and wherein.

DESCRIPTION OF THE PREFERRED EMBODIMENT(S)

Figure 1A:
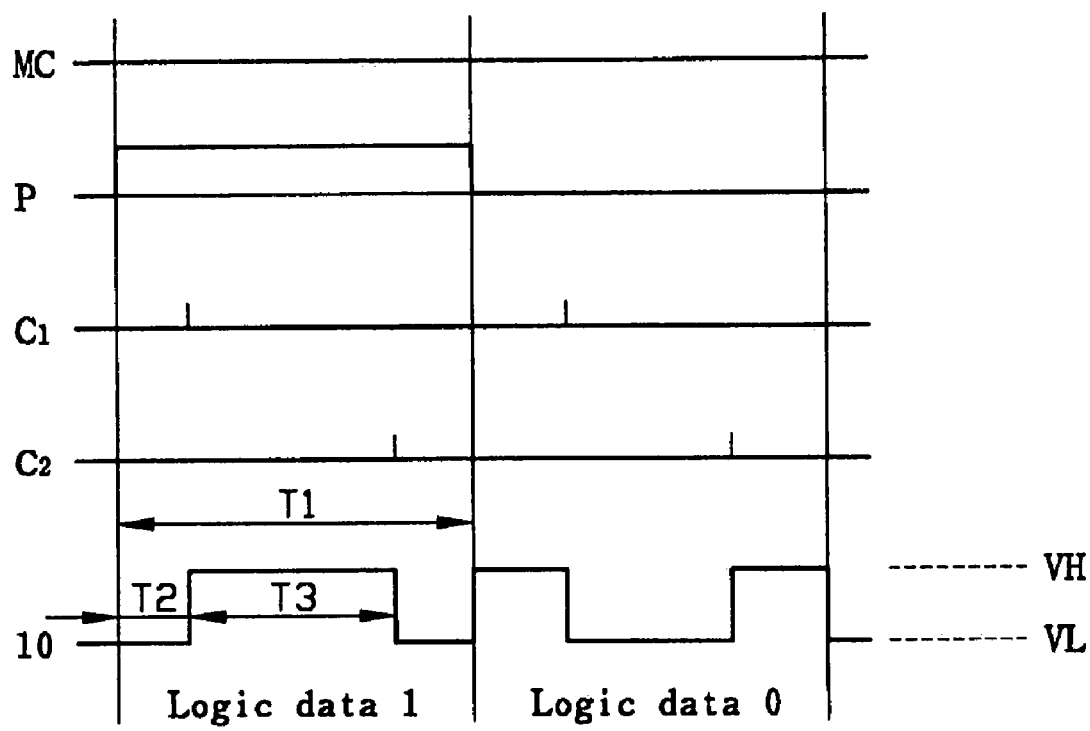
FIG. 1A shows a diagram illustrating major components of pulses.
Figure 1B:
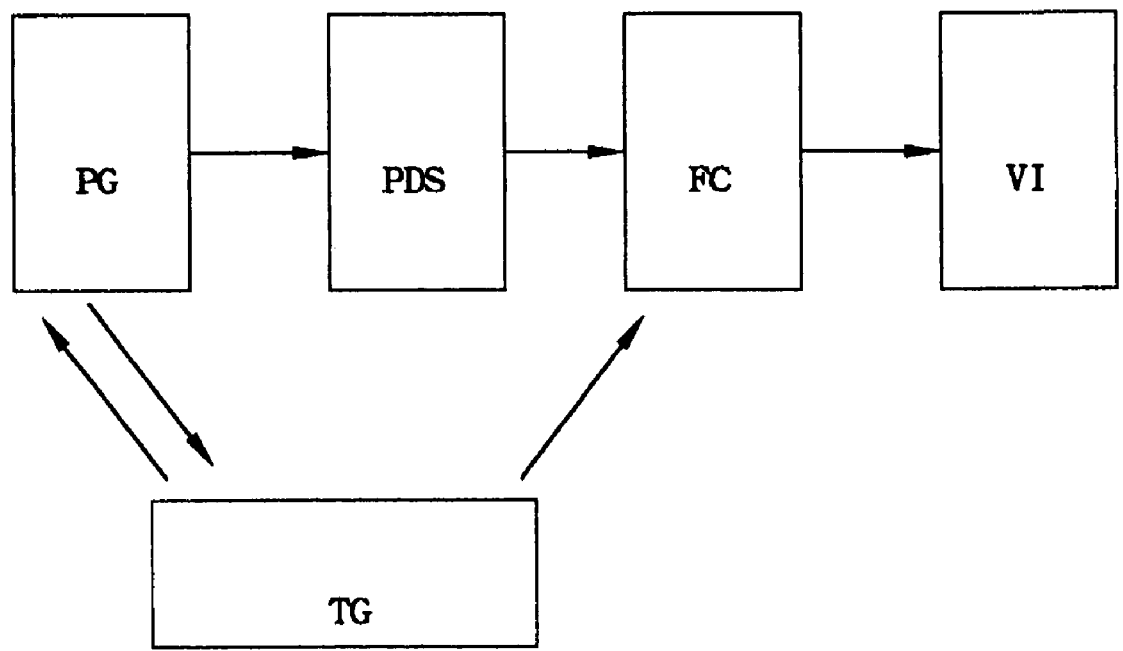
FIG. 1B depicts a block diagram illustrating high level functions of the prior art.

Having summarized various aspects of the present invention, reference will now be made in detail to the description of the invention as illustrated in the drawings. While the invention will be described in connection with these drawings, there is no intent to limit it to the embodiment or embodiments disclosed therein. On the contrary the intent is to cover all alternatives, modifications and equivalents included within the spirit and scope of the invention as defined by the appended claims.

It is noted that the drawings presented herein have been provided to illustrate certain features and aspects of embodiments of the invention. It will be appreciated from the description provided herein that a variety of alternative embodiments and implementations may be realized, consistent with the scope and spirit of the present invention.

It is also noted that the drawings presented herein are not consistent with the same scale. Some scales of some components are not proportional to the scales of other components in order to provide comprehensive descriptions and emphases to this present invention.

A high frequency signal transmission serializer disclosed in accordance with the present invention is capable to transmit a serial of high frequency signals for derivation of test pulses. In this regard, a serial of high frequency signals derived from a serial of data bits could be transmitted by the serializer. Hence different serials of data bits could be provided corresponding to different test pulses. It increases the reusability of test apparatus and does not need analog delay lines to test high frequency electronic elements in the prior art.

Figure 2A:
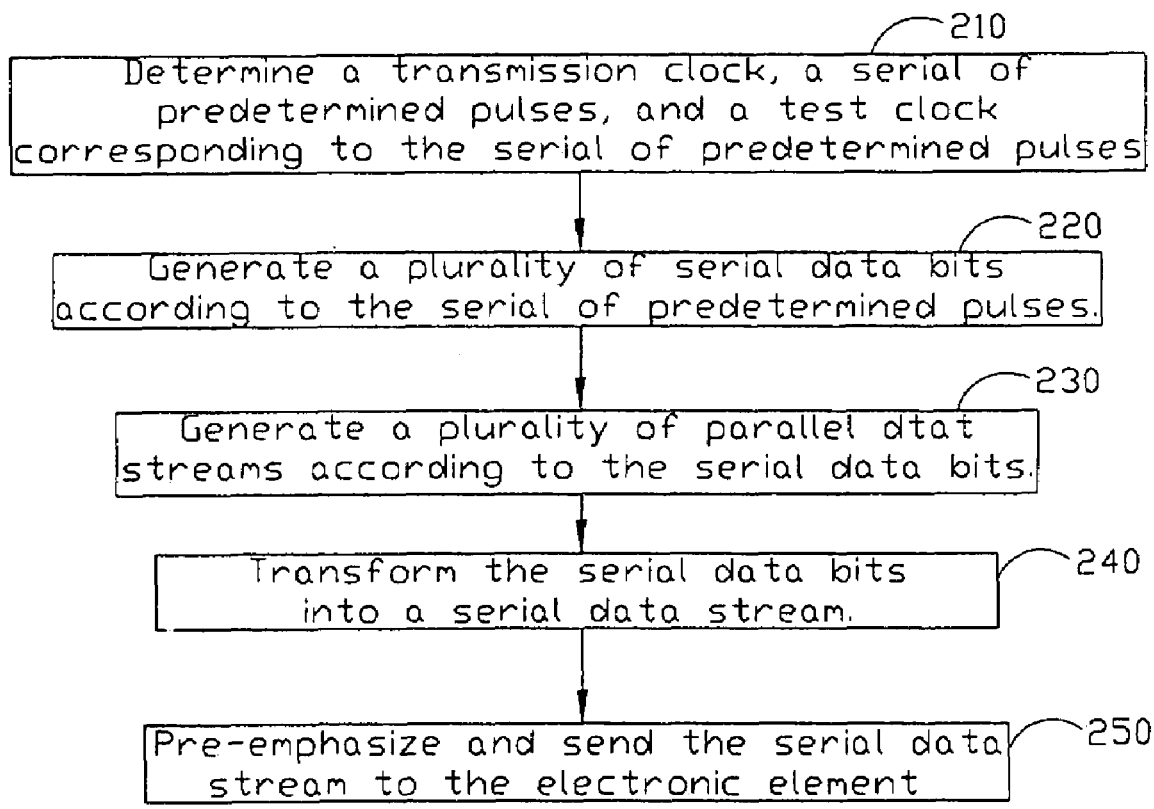
FIG. 2A shows a flowchart diagram in accordance with a preferred embodiment of the invention.

The functional test on electronic element is to drive the electronic element by a serial of test pulses corresponding to the test clock. The serial of test pulses could be generated from the test pattern of the electronic element and the test clock of the test pattern. Therefore, the functional test result of the electronic element could be determined by the serial of output pulses. In this regard, a method for generating test pulses to test electronic element in accordance with a preferred embodiment of the invention is shown in FIG. 2A. At first, a transmission clock is determined at step 210 from the test clock of the electronic element. In the meanwhile, the frequency of transmission clock should be a multiplier of the frequency of test clock. In other words, the test clock is synchronized to the transmission clock in the same multiplier of period. For example, in case the period of the test clock is 100 ns (nanosecond) and the period of the transmission clock is 5 ns, it takes one period for the test clock and 20 periods of the transmission clock in the same duration at test. It is also applicable for the transmission clock whose period is shorter than one nanosecond in accordance with the preferred embodiment of the invention.

The shorter period of transmission clock means a higher frequency of test pulses and the more precise control on the serial of test pulses.

Figure 2B:
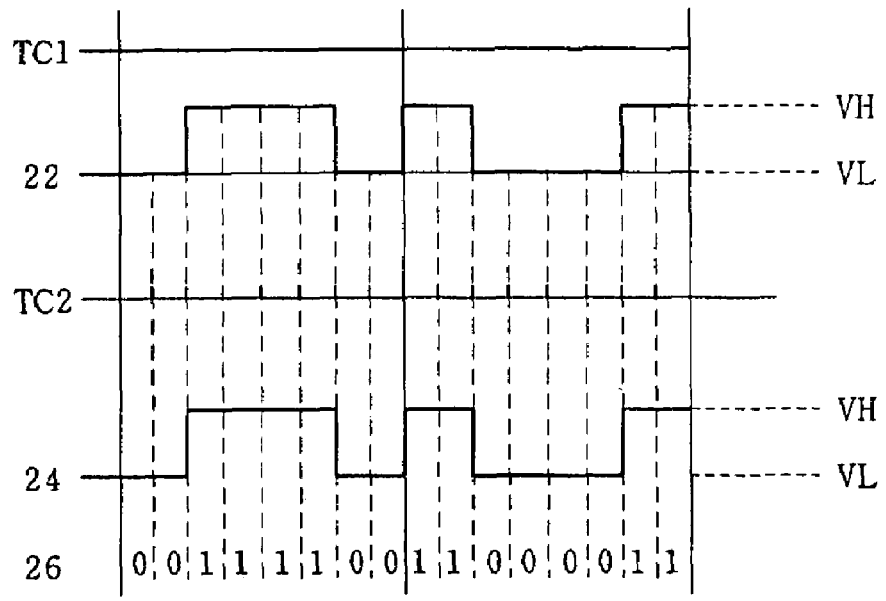
FIG. 2B shows an output diagram in accordance with a preferred embodiment of the invention.

Next step is shown at step 220, to generate multiple serials of data bits corresponding to the serials of predetermined pulses 22 and the transmission clock. As shown in FIG. 2B, the desired serial of predetermined pulses contains a combination of logical data 1s and 0s is generated corresponding to a test clock TC1. Each pulse representing a logical data 1 or 0 is consisted by several sub-pulses in the serial of sub-pulses 24 corresponding to the transmission clock. Since the sub-pulse maintains fixed voltage during its entire period, a serial of data bits can be interpreted from the logical data represented by the voltage of these sub-pulses. For example, the length ratio of periods between the test clock TC1 and the transmission clock TC2 is 8 to 1; therefore a pulse of the serial of predetermined pulses 22 is consisted of 8 sub-pulses in the serial of sub-pulses 24. Since each of the sub-pulses represents a logical data 1 or 0, a logical data 1 pulse of the serial of predetermined pulses 22 could be generated from a combination of eight sub-pulses representing logical data bits as "00111100". Similarly, a logical data 0 pulse of the serial of predetermined pulses 22 could be generated from a combination of eight sub-pulses representing logical data bits as "11000011". The serial of data bits 26 corresponding to the serial of predetermined pulses 22 could be generated by the logical data represented by the sub-pulses. For example, the serial of data bits 26 represents the logical data 1 and 0 corresponding to the serial of predetermined pulses 22 could be denoted as "00111100" and "11000011". In other words, a sub-pulse representing a data bit is sent in per period of the transmission clock. The voltage of the sub-pulse is determined by the value of the data bit and maintained during its period. Hence a serial of predetermined pulses could be denoted by a serial of data bits.

The serials of predetermined pulses 22 are usually referred to as a test pattern. The transformation from a logical data (say 1) to a binary pattern containing a plurality of serial data bits (say "00111100") may be performed according to a plurality of test pulse setting parameters. The number of leading 0's, for example, may be specified by an offset parameter to specify the transition point from the first data bit 0 to the first data bit 1. The number of 1's representing the width of the main pulse containing 1's may be specified by a width parameter. The setting parameters may also contain a format parameter to specify the format of a waveform (the aforementioned serial of high frequency signals) generated based on the plurality of serial data bits. Possible format parameters include but not limit to an RZ (return-to-zero) format, an RO (return-to-one) format, an NRZ (non-return-to-zero) and an NRO (non-return-to-one) format. For example, the transformation from the logical data 1 to the waveform shown in FIG. 1A is based on an RZ format in which the level other than the main pulse of the waveform returns to zero level. The offset and the width parameters may be specified based on a unit equaling the period of the transmission clock rate.

Moreover, the transformation may also depend on the test clock rate as well as the transmission rate. The transformation, for example, can be performed such that the number of the transformed data bits per one logical data (a binary digit) is equal to the ratio of the transmission clock rate to the test clock rate. In this regard, the present invention provides flexibility for different electronic elements with different test clock rates.

Next, as shown in step 230, multiple parallel data streams are generated by interleaving the bits of the serial of data bits to these multiple parallel data stream equally in order. For example, to transmit a plurality of bits through multiple paths, or to transmit a plurality of bits to multiple storage units of a storage media (e.g. registers, buffers, and memory), the plurality of bits could be interleaved to these paths or storage units in order as multiple parallel data streams.

Referring to step 240, a serial of data bits could be restored in order from the interleaved multiple parallel data streams in the previous step. At last, the serial of data bits is pre-emphasized and transmitted to the electronic element to be tested as shown in step 250. A sub-pulse corresponding to a bit of the serial of data bits is generated in a period of said transmission clock; and the sub-pulse maintains the voltage representing the logical data of correspondent bit value during the period.

Besides, the information of the serial of data bits is stored in multiple paths or storage units at step 230 and 240 before the serial of data bits is formed. It becomes possible to transmit the serial of data bits via a lower frequency logics or circuits by a serializer that works at a higher frequency. Since it is easier for the pulses to attenuate and have loss in power in transmission at higher frequency of transmission clock, to pre-emphasize the pulses before transmission could reduce the problems of attenuation and loss. In other words, a waveform (or pulses) generated based on the serial data bits is pre-emphasized before being sent to the electronic element under test. The pre-emphasizing function can be achieved by any known buffer element with suitable current gain or voltage gain.

Figure 3:
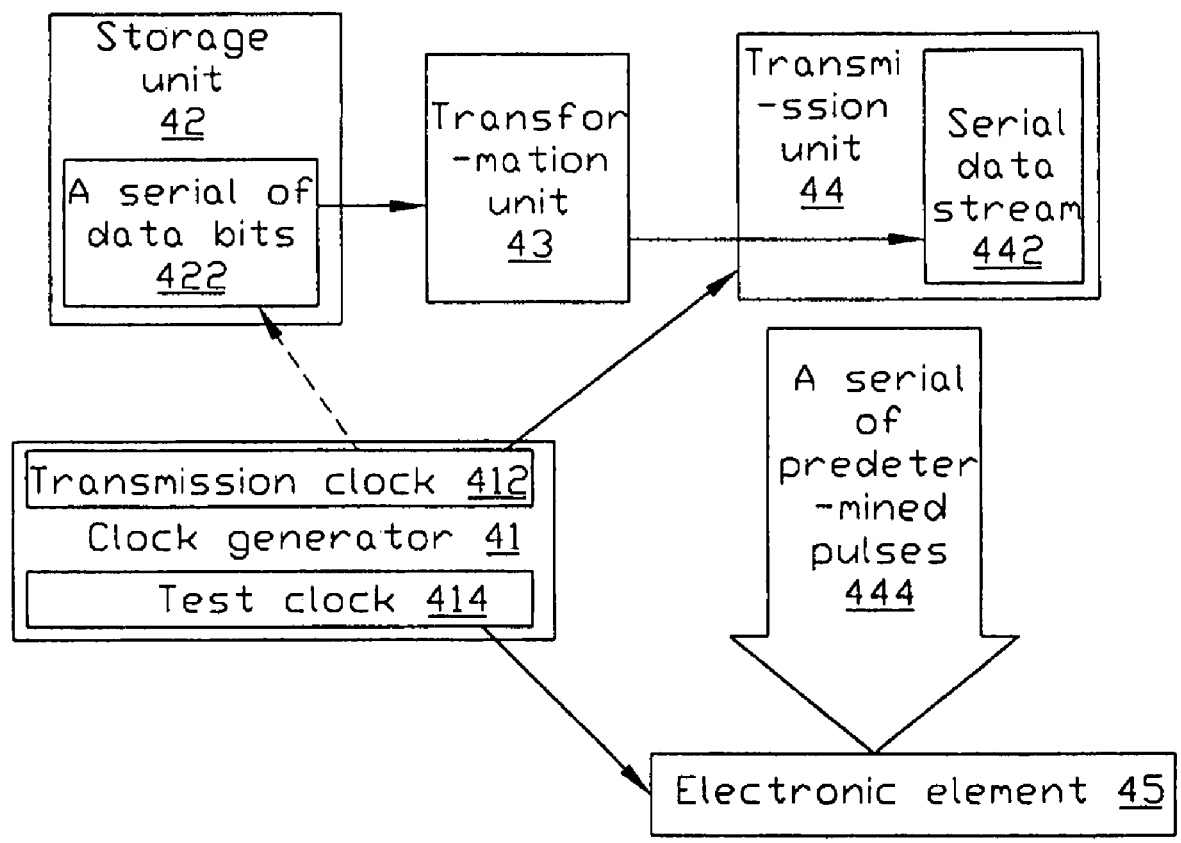
FIG. 3 shows a functional block diagram in accordance with a preferred embodiment of the invention.

Referring to FIG. 3, in accordance with a preferred embodiment of the present invention, a system for generating test pulses to test electronic element is disclosed. The system for generating test pulses comprises a clock generator 41, a storage unit 42, a transformation unit 43, and a transmission unit 44.

According to the description of step 210, a transmission clock 412 is determined from the test clock 414 of the electronic element 45 to be tested. Next, a serial of data bits 422 corresponding to the transmission clock 412 is determined from the desired serial of predetermined pulses 444. In this regard, the test clock 414 and the transmission clock 412 are both generated by the clock generator 41; the serial of data bits 422 is stored in the storage unit 42. As what is described in step 230 and step 240, a serial data stream 442 is transformed by the transformation unit 43 from the serial of data bits 422. Finally, the transmission unit 44 transmits the serial data stream 442 in the form of the serial of predetermined pulses corresponding to transmission clock 412 to the electronic element 45.

The transformation unit 43 and the transmission unit 44 are used to transmit the serial data stream 442 corresponding to the transmission clock 412. The functionalities performed by the transformation unit 43 and the transmission unit 44 could be done by a serializer, too. The function of a serializer is to transmit serial data stream in higher frequency from the received parallel data streams in lower frequency. Moreover, this embodiment of the present invention could further comprise a data bits generation unit. Therefore the serial of predetermined pulses could be inputted into the data bits generation unit in other formats (e.g. programming languages or text data) and the serial of data bits could be generated according to the test clock and the transmission clock.

In accordance with one preferred embodiment of the present invention, a programmable latch array or a field programmable gate array (FPGA) with serializers for generating test pulses to test electronic elements is disclosed. The programmable latch array with serializers comprises a storage unit, a serializer, a clock generator, and a logic circuit for the performance of the programmable latch array. In this regard, the serial of data bits could be stored in the storage unit; it could also be transmitted by the serializer in the transmission clock. The clock generator and the transmission unit could be implemented inside the programmable latch array or be provided from the external logic circuits. Furthermore, a data bits generation unit could also be implemented inside the programmable latch array. The storage unit may also store the aforementioned plurality of test pulse setting parameters. In accordance with another embodiment of the present invention, for flexibility purpose, an external storage unit (not shown in FIG. 3), such as a DRAM (dynamic random access memory) or a SRAM (static random access memory), may be incorporated into the system generating test pulses to test electronic elements. The external storage unit may store the test pattern before transformation and the plurality of data bits after transformation. Since embedded storage unit in a field programmable gate array usually has limited space, an external storage unit may offer a more flexible architecture for a variety of different electronic elements under test.

The foregoing description is not intended to be exhaustive or to limit the invention to the precise forms disclosed. Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the inventions as determined by the appended claims when interpreted in accordance with the breadth to which they are fairly and legally entitled.

What is claimed is:

1. A method for generating test pulses from a test pattern to test an electronic element operating at a test clock rate, comprising:
   receiving a binary digit (bit) representing part of said test pattern;
   receiving a plurality of test pulse setting parameters;
   transforming said binary digit to a plurality of serial data bits according to said plurality of test pulse setting parameters, said test clock rate and a transmission clock rate; and
   transmitting said serial data bits to said electronic element at said transmission clock rate,
   wherein said transmission clock rate is higher than said test clock rate, and said plurality of test pulse setting parameters specify a format of the test pulses, a transition point of the test pulses and a width of a main pulse of the test pulses, said format comprising RZ (return-to-zero), NRZ (non-return-to-zero), RO (return-to-one) or NRO (non-return-to-one).

2. The method of claim 1, wherein said transition point and said width of the main pulse are specified based on a unit equaling a period of said transmission clock rate.

3. The method of claim 2, wherein number of said plurality serial data bits is equal to a ratio of said transmission clock rate to said test clock rate.

4. The method of claim 1, wherein said transmitting step comprises pre-emphasizing a waveform generated based on said serial data bits before said waveform is fed into said electronic element.

5. A system for generating test pulses from a test pattern to test an electronic element operating at a test clock rate, comprising:
   an external storage unit for storing said test pattern; and
   a processing unit comprising a transformation unit and a transmission unit,
   wherein said transformation unit is configured to receive a binary digit representing part of said test pattern from said external storage, receive a plurality of test pulse setting parameters and transform said binary digit to a plurality of serial data bits according to said plurality of test pulse setting parameters, said test clock rate and a transmission clock rate;
   wherein said transmission unit transmits said serial data bits to said electronic element at said transmission clock rate, said transmission clock rate being higher than said test clock rate, and
   said plurality of test pulse setting parameters specify a format of the test pulses, a transition point of the test pulses and a width of a main pulse of the test pulses, said format comprising RZ (return-to-zero), NRZ, (non-return-to-zero), RO (return-to-one) or NRO (non-return-to-one).

6. The system of claim 5, wherein said transition point and said width of the main pulse are specified based on a unit equaling a period of said transmission clock rate.

7. The system of claim 6, wherein number of said plurality serial data bits is equal to a ratio of said transmission clock rate to said test clock rate.

8. The system of claim 5, wherein said processing unit further comprises an internal storage unit configured to said plurality of test pulse setting parameters.

9. The system of claim 5, further comprises a buffer element configured to pre-emphasize a waveform generated based on said serial data bits before said waveform is fed into said electronic element.

10. The system of claim 5, wherein said processing unit is a field programmable gate array (FPGA).

11. The system of claim 10, wherein said transmission unit is a serializer embedded in said field programmable gate array.

* * * * *